(12) United States Patent
Tanie et al.

(10) Patent No.: US 7,119,428 B2
(45) Date of Patent: Oct. 10, 2006

(54) SEMICONDUCTOR DEVICE

(75) Inventors: Hisashi Tanie, Tsuchiura (JP); Nae Hisano, Matsudo (JP); Hiroyuki Ohta, Tsuchiura (JP); Hiroaki Ikeda, Tokyo (JP); Ichiro Anjo, Tokyo (JP); Mitsuaki Katagiri, Tokyo (JP); Yuji Watanabe, Tokyo (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/025,634

(22) Filed: Dec. 28, 2004

(65) Prior Publication Data

US 2005/0189639 A1    Sep. 1, 2005

(30) Foreign Application Priority Data

Mar. 1, 2004    (JP) ............................. 2004-055630

(51) Int. Cl.
*H01L 23/22* (2006.01)
*H01L 23/053* (2006.01)
*H01L 21/44* (2006.01)

(52) U.S. Cl. ...................... 257/686; 257/687; 257/700; 257/723; 438/107; 438/109

(58) Field of Classification Search ................ 257/686, 257/687, 700, 723; 438/107, 109
See application file for complete search history.

(56) References Cited

U.S. PATENT DOCUMENTS 3,648,131 A    3/1972    Stuby 5,229,647 A    7/1993    Gnadinger
6,141,245 A    10/2000   Bertin et al.
6,492,718 B1 *  12/2002   Ohmori ...................... 257/686

FOREIGN PATENT DOCUMENTS

| JP | 59-222954 | 12/1984 |
|----|-----------|---------|
| JP | 61-088546 | 5/1986 |
| JP | 63-156348 | 6/1988 |
| JP | 08-236694 | 9/1996 |
| JP | 11-040745 | 2/1999 |
| JP | 2000-286380 | 10/2000 |

* cited by examiner

*Primary Examiner*—Hsien-Ming Lee
(74) *Attorney, Agent, or Firm*—Townsend and Townsend and Crew LLP

(57) ABSTRACT

A semiconductor device capable of reducing a temperature increase during operation thereof is provided. In the semiconductor device, an interface chip is stacked on a plurality of stacked semiconductor elements. Both an "Si" interposer and a resin interposer are arranged under the plural semiconductor elements. The Si interposer is arranged between the resin interposer and the plural semiconductor elements. The Si interposer owns a thickness which is thicker than a thickness of a semiconductor element, and also has a linear expansion coefficient which is smaller than a linear expansion coefficient of the resin interposer, and further, is larger than, or equal to linear expansion coefficients of the plural semiconductor elements.

8 Claims, 10 Drawing Sheets

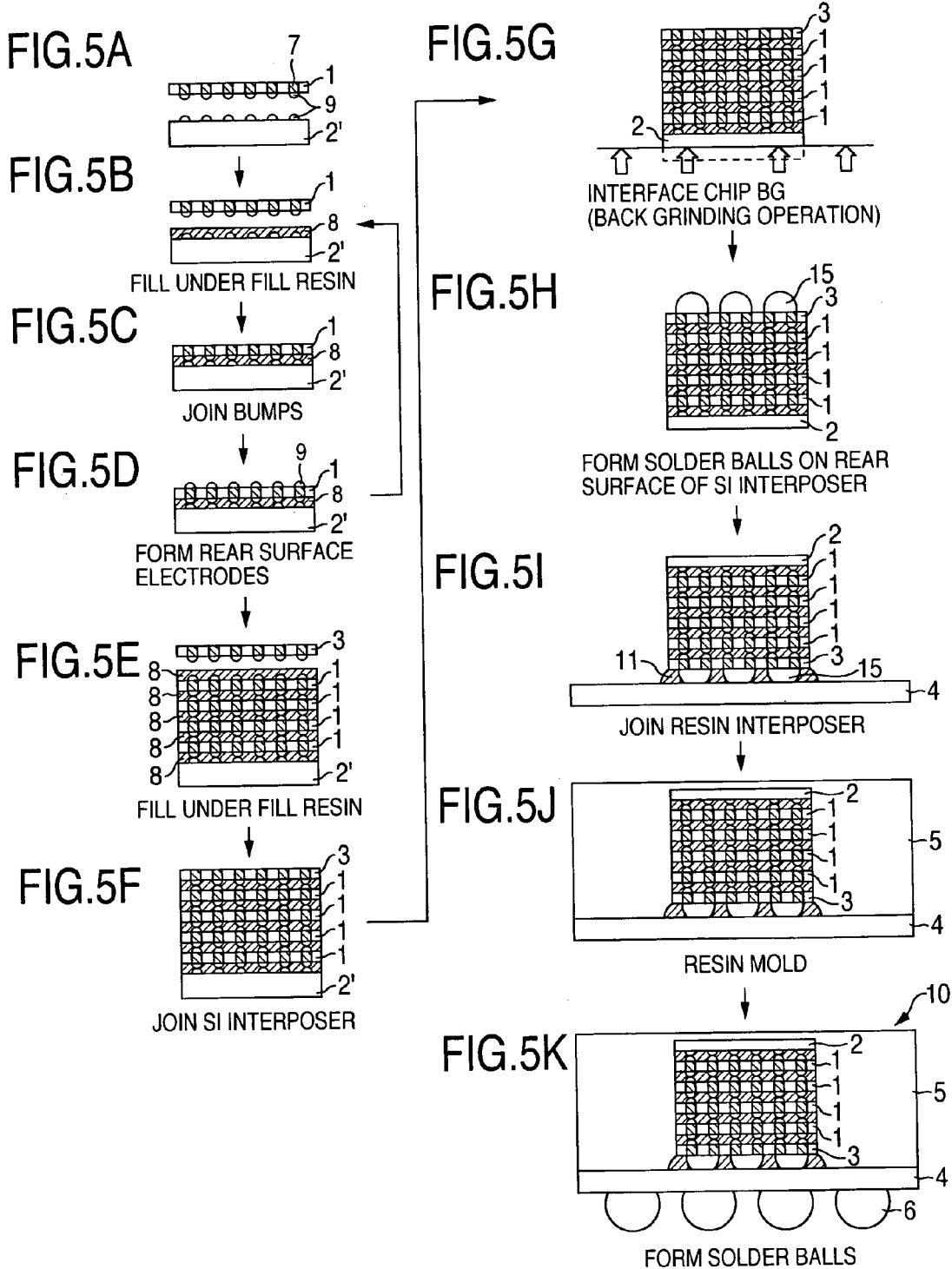

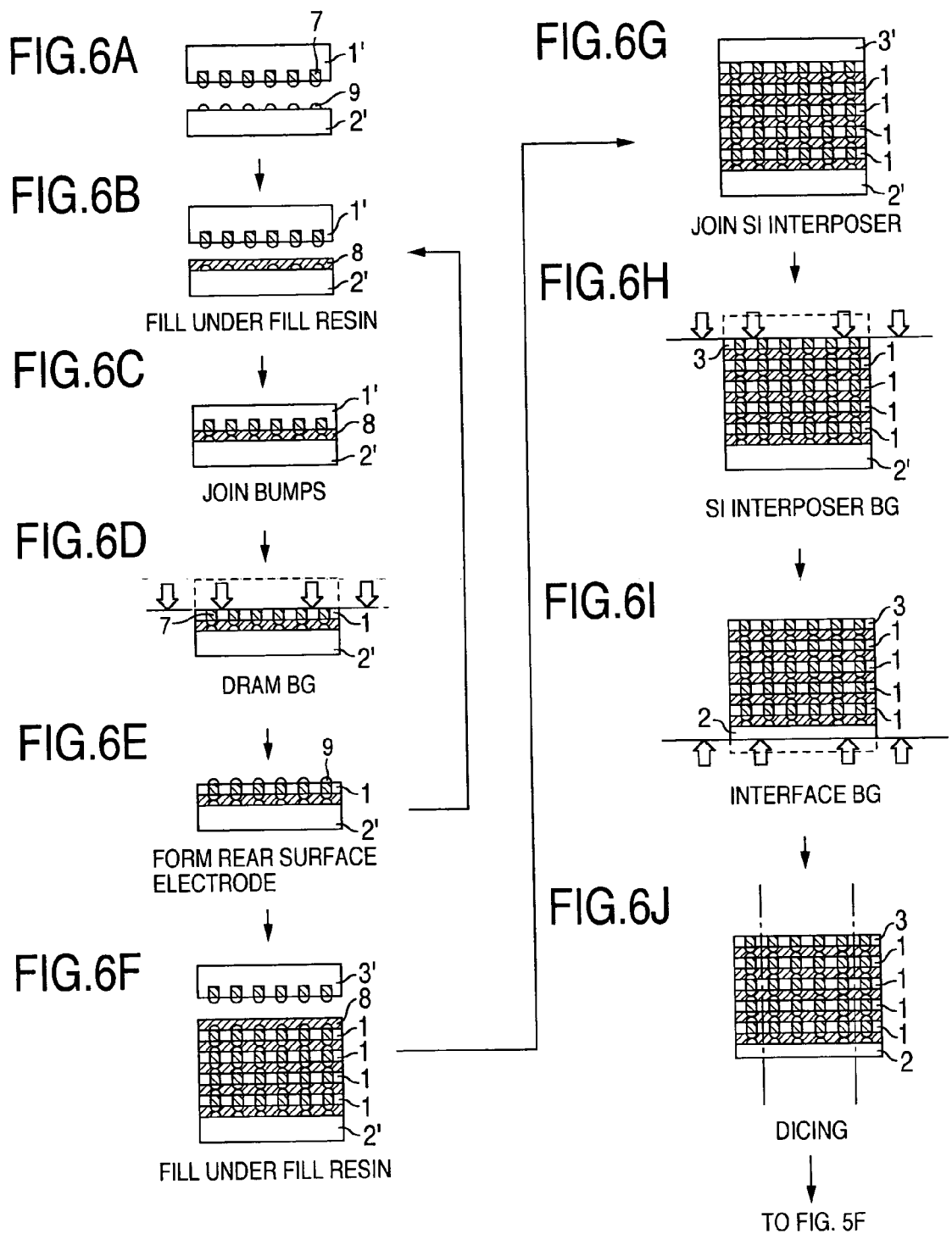

SEMICONDUCTOR DEVICE

BACKGROUND OF THE INVENTION

The present invention generally relates to a semiconductor device. More specifically, the present invention is directed to a semiconductor device suitably designed for mounting a plurality of semiconductor elements in a stack manner.

Semiconductor devices, especially, semiconductor memories have been used in various sorts of information appliances such as large-scaled computers, personal computers, and portable appliances, while memory capacities required thereof are increased year by year. On the other hand, mounting areas of these semiconductor memories are increased in connection with large memory capacities, which may cause a certain factor to impede compactnesses of these information appliances. Under such a circumstance, various techniques capable of mounting semiconductor memories in high mounting density have been developed. As techniques capable of realizing memories having large storage capacities within limited mounting areas, for instance, JP-A-11-40745, JP-A-8-236694, and JP-A-2000-286380 describe such a technical idea that semiconductor packages are stacked on mounting substrates. Also, U.S. Pat. No. 3,648,131, U.S. Pat. No. 6,141,245, U.S. Pat. No. 5,229,647, JP-A-59-222954, JP-A-61-88546, and JP-A-63-156348 disclose such a technical idea that a plurality of semiconductor elements are mounted in a stack manner within a single semiconductor package, and then, the stacked semiconductor elements are connected to each other by employing through holes formed in the semiconductor elements.

However, in the case that a plurality of DRAMs are mounted in a stack manner within a single semiconductor package, a heat value of the entire semiconductor package becomes large, as compared with that of a semiconductor package on which a single sheet of DRAM is mounted. As a result, there are certain risks as to operation failures and destruction of semiconductor elements, which are caused by temperature increases during operations of the semiconductor devices.

BRIEF SUMMARY OF THE INVENTION

An object of the present invention is to provide a semiconductor device capable of lowering temperature increases while the semiconductor device is operated.

(1) To achieve the above-described object, a semiconductor device, according to the present invention, is featured by such a semiconductor device having a plurality of semiconductor devices which have been stacked to each other, in which at least one semiconductor element among the plural semiconductor devices is electrically conducted to another semiconductor element by employing a penetrating electrode, comprising: an interface chip which is stacked on, or under the plurality of stacked semiconductor elements, and which constitutes an interface for interfacing between the semiconductor elements and an external unit.

With employment of the above-described structure, the wiring lines between the plurality of stacked semiconductor elements and the interface chip can be made short, and the temperature increase during operation can be reduced.

(2) In the above-described (1), the interface chip may be preferably arranged on an uppermost layer of said plurality of stacked semiconductor elements.

(3) In the above-described (1), the semiconductor device may preferably is comprised of: a resin interposer; and a second interposer which is arranged between the resin interposer and the plurality of stacked semiconductor elements, which has a thickness thicker than a thickness of the semiconductor element, and owns a linear expansion coefficient; the linear expansion coefficient of the second interposer being smaller than a linear expansion coefficient of the resin interposer, and also being larger than, or equal to linear expansion coefficients of the plurality of stacked semiconductor elements.

(4) In the above-described (3), the semiconductor device may be preferably and further comprised of: a second interposer which is arranged on an uppermost layer of the plurality of stacked semiconductor elements and has a thickness thicker than, or equal to a thickness of the semiconductor element, and also, owns a linear expansion coefficient; the linear expansion coefficient of the second interposer being larger than, or equal to linear expansion coefficients of the plurality of stacked semiconductor elements; and a resin interposer; wherein: the interface chip is arranged between the resin interposer and the plurality of stacked semiconductor elements.

(5) In the above-described (3),or (4), the second interposer may be preferably constructed of Si (silicon).

(6) In the above-described (1), at least two, or more sheets of the semiconductor elements may preferably correspond to memories.

In accordance with the present invention, the temperature increase when the semiconductor device is operated can be reduced.

Other objects, features and advantages of the invention will become apparent from the following description of the embodiments of the invention taken in conjunction with the accompanying drawings.

BRIEF DESCRIPTION OF THE SEVERAL VIEWS OF THE DRAWING

FIG. 5A to FIG. 5k are step diagrams for representing a first manufacturing method of the semiconductor device according to the first embodiment of the present invention.

FIG. 6A to FIG. 6J are step diagrams for representing a second manufacturing method of the semiconductor device according to the first embodiment of the present invention.

DETAILED DESCRIPTION OF THE INVENTION

Referring now to FIG. 1 to FIG. 6J, a description is made of a structure of a semiconductor device according to a first embodiment of the present invention. In the below-mentioned description, such a semiconductor memory in which DRAMs have been stacked is exemplified as the semiconductor device.

First, an entire structure of the semiconductor device according to this first embodiment will now be described.

Figure 1:
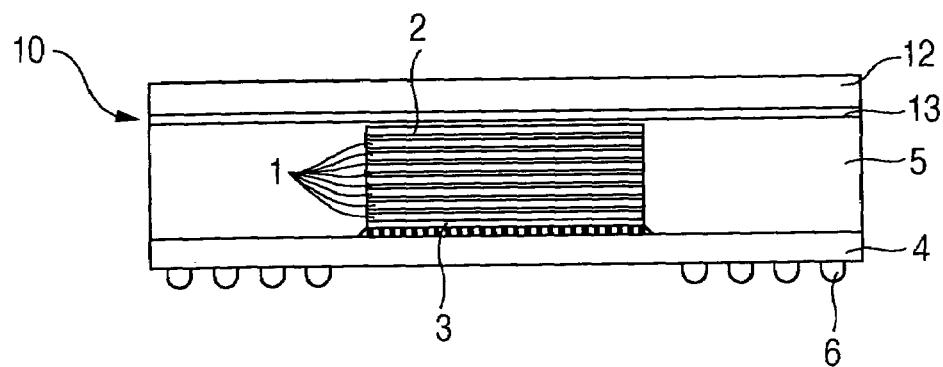
FIG. 1 is a sectional side view for showing an entire structure of a semiconductor device according to a first embodiment of the present invention.

FIG. 1 is a sectional side view for showing an entire structure of the semiconductor device 10 according to the first embodiment of the present invention.

Figure 2:
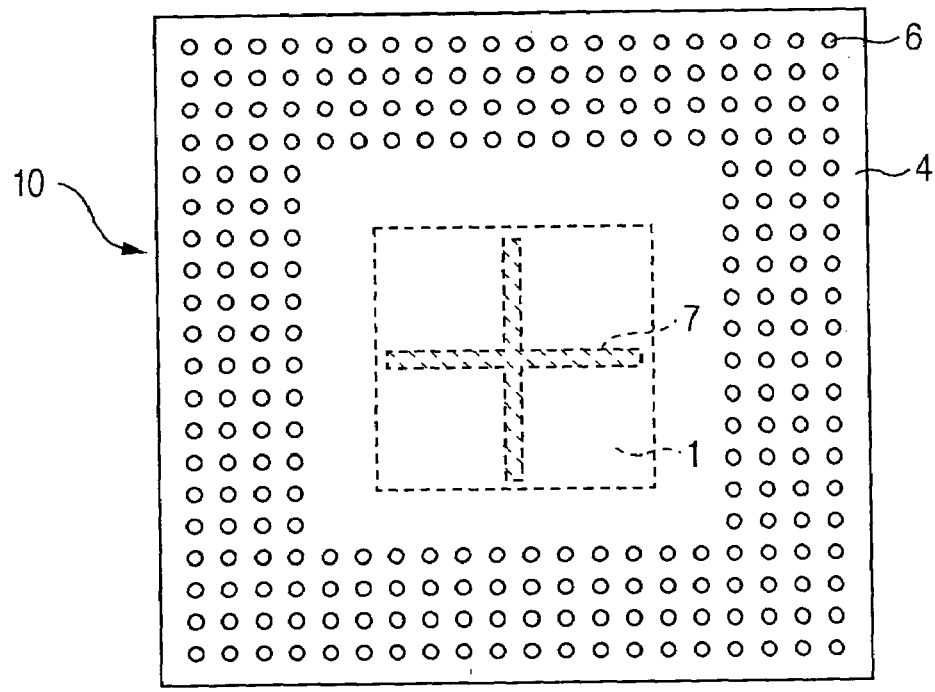
FIG. 2 is a bottom view for representing an entire structure of the semiconductor device according to the first embodiment of the present invention.

FIG. 2 is a bottom view for representing an entire structure of the semiconductor device 10 according to the first embodiment of the present invention.

As indicated in FIG. 1, this semiconductor device 10 is constituted by 8 sheets of DRAM chips 1, an interface chip 2, an "Si" interposer 3 and a resin substrate interposer 4. The DRAM chips 1 have been stacked on each other. The interface chip 2 is arranged on an upper portion of the DRAM chips 1. The Si interposer 3 corresponds to a second interposer which is arranged at a lower portion the stacked DRAM chips 1. The resin substrate interposer 4 is arranged at a lower portion of this Si interposer 3. These members 1, 2, 3, and 4 are sealed by using mold resin 5. Furthermore, a solder ball 6 is provided and functions as an external terminal which is used so as to be connected with a module board. Assuming now that a storage capacity of each of the DRAM chips 1 is equal to, for instance, 512 Mbits, the semiconductor device 10 having a storage capacity of 0.5 G bytes can be realized by 8 layers of the DRAM chips 1 shown in FIG. 1.

Memory cells are constituted by employing the plural sheets of DRAM chips 1. The interface chip 2 controls all of the memory cells in an unified manner, and may function as an interface of a DRAM corresponding to a semiconductor element with respect to an external portion. The plural sheets of DRAM chips 1 are connected to the interface chip 2 by employing a penetrating electrode 7 shown in FIG. 2. A structure of this penetrating electrode 7 will be described later with reference to FIG. 3. In a conventional memory module, a plurality of semiconductor devices and an interface chip for controlling these semiconductor devices are separately mounted on a module board, and these semiconductor devices and the interface chip are connected to each other by way of wiring lines. In contrast, in the semiconductor device 10 of this first embodiment, since the interface chip 2 is mounted on the stacked DRAM chips 1, physical distances between the interface and the memory cells can be made shorter. Also, a total number of the interfaces can be reduced, as compared with that of the conventional memory module. As a result, heating values which are produced in communications between the interface and the memory cells can be reduced, and also, a heating value of the interface itself can be reduced.

Also, since the stacked DRAM chips 1 do not own the interface function, a heating value of each of the DRAM chips 1 can be reduced. Furthermore, since the interface chip 2 having the large heating value is installed on the uppermost layer of the semiconductor (DRAM) chips to be stacked, the heat generation occurred in the interface chip 2 can be effectively dissipated by heat radiation from the upper plane of the semiconductor device 10. As a result, the temperature increase of the semiconductor device 10 during operation can be suppressed. Based upon these temperature reducing effects, a large storage semiconductor device containing the plural sheets of DRAM chips 1 can be operated without erroneous operation and destruction which are caused by heat generations.

In this case, dimensions of planes as to the DRAM chip 1, the interface chip 2, and the Si interposer 3 are equal to each other, for instance, correspond to a square shape made of one edge of 7 mm. Since thickness of the respective chips are set in such a manner that a thickness of each of the DRAM chips 1 is 50 μm; and a thickness of each of the interface chip 2 and the Si interposer 3 is 60 μm, a semiconductor device in which a large number of these chips have been stacked can be manufactured with a low mounting height.

Also, since the thicknesses (for example, 60 μm) of the interface chip 2 and the Si interposer 3 are made thicker than, or equal to the thicknesses (for instance, 50 μm) of the DRAM chips 1, heat stress produced in the DRAM chips 1 due to temperature changes when the semiconductor device is assembled and is operated can be reduced, and further, it is possible to avoid that since the DRAM chips 1 are contaminated by the resin of the peripheral portion, the element characteristic is deteriorated.

In other words, when external force is applied to the DRAM chips 1 and thus large stress is produced inside the DRAM chips 1, there are certain risks that the performance thereof is lowered, for instance, refresh performance is deteriorated, and also, the destruction such as broken chips occurs. More specifically, in such a case that a thickness of Si is made thin, for example, several tens of μm in order to stack Si chips, rigidity of the Si chips is decreased, and an adverse influence caused by a difference of linear expansion coefficients between the Si chips and a resin substrate to be connected, or resin to be molded may be largely given. As a consequence, large thermal stress may be produced inside the DRAM chips 1 during the operation. Also, there is a certain risk that the performance of the DRAM chips 1 is deteriorated which is caused by contamination made from the resin located adjacent to the DRAM chips 1. In contrast to the above-described structure, as previously explained, since both the interface chip 2 and the Si interposer 3 are provided on both the upper layer and the lower layer of the DRAM chips which are to be stacked, it can be avoided that the DRAM chips 1 are directly connected to the resin substrate and/or the resin in a planer manner. As a result, since a difference in thermal deformation amounts which are caused by the difference in linear expansion coefficients between Si and the peripheral resin, which is produced during the operation, may be absorbed by the interface chip 2 and the interposer 3, the stress produced in the DRAM chips 1 can be lowered. Also, since the rear planes of the DRAM chips 1 can be protected from the resin by the interface chip 2 and the interposer 3, contamination can be prevented.

The Si interposer 3 corresponding to the second interposer is arranged between the DRAM chips 1 having the Si substrates and the resin substrate interposer 4. Since the linear expansion coefficient of the DRAM chips 1 having the Si substrates is different from the linear expansion coefficient of the resin substrate interposer 4, this Si interposer 3 corresponding to the second interposer may also be employed as a buffer member capable of blocking that stress produced in the resin substrate interposer 4 is transferred to the DRAM chips 1 having the Si substrates. In this embodiment, since the Si interposer 3 is employed as the second interposer, the linear expansion coefficient of the second interposer is equal to the linear expansion coefficient of the DRAM chips 1 having the Si substrates. However, the present invention is not limited only to this example, but may be modified. That is, as the second interposer, any member may be employed if a linear expansion coefficient of this member is larger than, or equal to the linear expansion coefficient of each of the DRAM chips 1 having the Si substrates, and moreover, is smaller than the linear expansion coefficient of the resin substrate interposer 4. Concretely speaking, for instance, ceramics such as an aluminium nitride and an alminium oxide may be employed.

As shown in FIG. 2, the penetrating electrode 7 is arranged in a cross shape 14 at a center portion of the DRAM chips 1. Since the penetrating electrode 7 is arranged in such a shape, even in the case that a dimension of a chip is changed due to shrink of the chip and due to a change of the capacities, or even when chips having different dimensions are mixed with each other to be mounted, these DRAM chips 1 may be stacked without changing the arrangement of the penetrating electrode 7.

The resin substrate interposer 4 has a square shape having a plane dimension of 18 mm, and corresponds to FR-4 having 4 wiring layers. The solder ball 6 having a diameter of approximately 300 µm is provided on the lower plane of the resin substrates interposer 4 as an external terminal used to be connected to the module board. As shown in FIG. 2, a plurality of solder balls 6 are arranged in 4 columns×4 rows at a peripheral portion of the resin substrate interposer 4, but are not arranged just under the DRAM chips 1. As explained above, since the solder balls 6 are arranged, it is possible to avoid that the difference in the thermal deformation amounts between the module board and "Si" such as the DRAM chips 1, the interface chip 2, and the Si interposer 3, which are caused by the temperature changes during the operations may directly give an influence as shearing deformation of the solder balls 6. As a result, solder connecting reliability can be secured.

A radiating plate 12 made of a metal is provided on the upper plane of the semiconductor device 10. A plane dimension of the radiating plate 12 is the same as that of the resin substrate interposer 4, namely is a square shape having one edge of 18 mm. A thickness of the radiating plate 12 is 0.3 mm. It should also be noted that the radiating plate 12 is joined to the mold resin 5 by employing thermal conducting resin 13 having a thickness of 0.2 mm. In this first embodiment, a heat generating portion when the semiconductor device 10 is operated is mainly located in the interface chip 2 and the DRAM chips 1. In other words, the heat generating portion is equal to 7×7=49 mm² with respect to the plane dimension of 18×18=324 mm² as to the entire semiconductor device 10, namely corresponds to approximately 15% of the entire area. As a result, the heat generated from the DRAM chips 1 and the interface chip 2 can be diffused by the radiating plate 12 in a plane manner, and thus, the temperature increase when the semiconductor device is operated can be lowered. Since a copper alloy having a high thermal conductivity is employed in the radiating plate 12, this radiating plate 12 owns such a structure that the heat generated from the DRAM chips 1 can be diffused in a plane manner.

Figure 3:
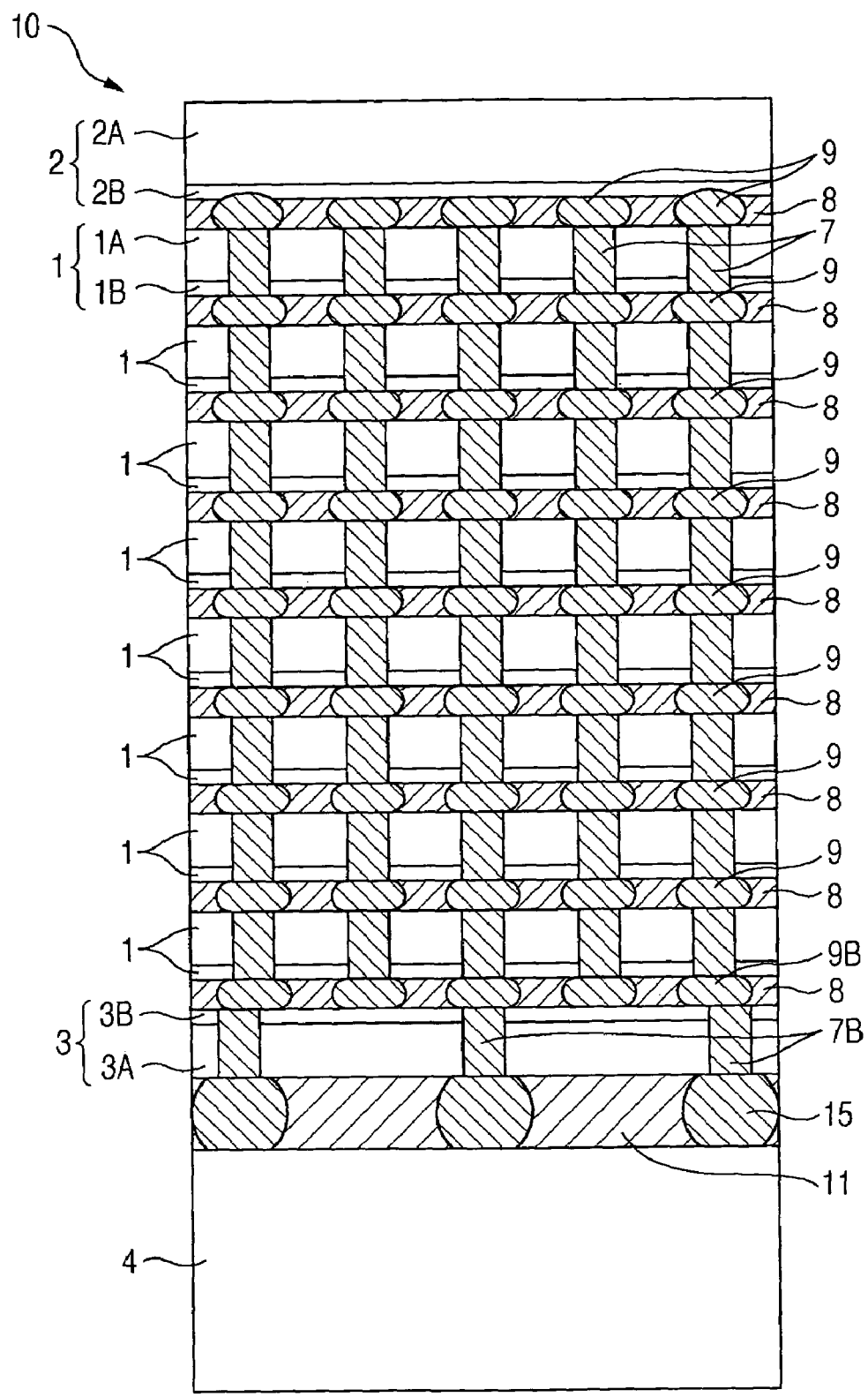
FIG. 3 is a sectional view for indicating a major structure of the semiconductor device according to the first embodiment of the present invention.

Next, a description is made of a sectional structure of a major portion of the semiconductor device 10 according to this first embodiment with reference to FIG. 3.

FIG. 3 is a sectional view for indicating the semiconductor device 10 according to the first embodiment of the present invention. It should be noted that the same reference numerals shown in FIG. 1 and FIG. 2 indicate the same structural portions as those indicated in FIG. 3.

The interface chip 2 is provided at an uppermost layer within Si (silicon) chips which will be stacked. The interface chip 2 is constituted by an "Si" substrate 2A, and a circuit layer 2B. The circuit layer 2B has been formed on a surface of the Si substrate 2A by way of an integrated circuit technique, and owns an interface function. Since the interface chip 2 is provided at the uppermost layer, the penetrating electrode 7 is no longer provided with the interface chip 2.

8 sheets of the DRAM chips 1 have been stacked on the lower portion of the interface chip 2. All of these 8 DRAM chips 1 have the same structures. A DRAM chip 1 is arranged by an "Si" substrate 1A and a circuit layer 1B. The circuit layer 1B constitutes a memory cell which has been formed on a surface of the Si substrate 1A by way of an integrated circuit technique.

The penetrating electrode 7 which penetrates "Si" (silicon) is provided on each of the DRAM chips 1, and can establish a communication operation between the DRAM chips 1 and the interface chip 2. The penetrating electrode 7 is constituted in such a manner that an insulating layer is provided on a penetrating hole having a diameter of approximately 30 µm formed in Si, and Poly-Si is filled into the penetrating hole. Since the penetrating electrode 7 is constructed of Poly-Si, thermal stress concentration in the vicinity of the penetrating electrode 7 can be reduced, as compared with that of such a case that the penetrating electrode 7 is constructed of Cu having a large difference of linear expansion coefficients with respect to Si. As a consequence, even when a memory cell is arranged in the vicinity of the penetrating electrode 7, produced stress is small, and a characteristic change in a memory element caused by the stress can be prevented. Since the memory cell can be arranged in the vicinity of the penetrating electrode 7 due to the above-described reason, the chip area can be effectively utilized.

Bumps 9 are used to join between the penetrating electrodes 7 of the respective DRAM chips 1 in order to conduct the respective DRAM chips 1 to the interface chip 2, while the bumps 8 have been sealed by using under fill resin 8. In this embodiment, since Au (gold) is employed in the bumps 9 and another resin having a linear expansion coefficient close to that of Au is employed in the under fill resin 8, thermal stress occurred in the bumps 8 when the temperature is changed can be reduced, so that the connection reliability can be secured. A height of the bumps 9 after the joining operation is approximately 20 µm.

The Si interposer 3 is arranged on the lower portion of the stacked DRAM chips 1. The Si interposer 3 is constituted by an "Si" substrate 3A and a wiring layer 3B. The wiring layer 3B has been formed on the surface of the Si substrate 3A. A plurality of penetrating electrodes 7B are provided, while the penetrating electrodes 7B penetrate through the Si substrate 3A. A pitch of the penetrating electrodes 7 provided in the DRAM chips 1 is selected to be 70 μm, whereas a pitch of the penetrating electrodes 7B provided in the Si interposer 3 is selected to be 200 μm. The wiring layer 3B is employed so as to connect the bumps 9B having the pitch of 70 μm to the penetrating electrodes 7B having the pitch of 200 μm. The bumps 9B are used to be connected to the DRAM chips 1. A wiring pitch is extended up to 200 μm by the wiring layer 3B. As a consequence, the places of the penetrating electrodes 7B of the Si interposer 3 are different from the places of the penetrating electrodes 7 of the DRAM chips 1.

While the resin substrate interposer 4 is arranged on the lower portion of the Si interposer 3, the solder balls 15 provided on the lower portion of the penetrating electrodes 7B of the Si interposer 3 are used to join between the Si interposer 3 and the resin substrate interposer 4. The solder balls 15 are sealed by employing the under fill resin 11. At this time, since such a material whose linear expansion coefficient is nearly equal to that of a solder is employed, it is possible to avoid that reliability of the connection portion is lowered which is caused by the temperature change. The resin substrate interposer 4 owns four wiring layers. A wiring pitch of the wiring layers at the uppermost layer is selected to be 200 μm so as to be connected to the Si interposer 3; a wiring pitch in the internal wiring layer is enlarged; and a bump pitch at the lowermost layer is selected to be 800 μm. As indicated in FIG. 1 and FIG. 2, the solder ball 6 having the diameter of approximately 300 μm used to be connected to the module board is provided on each of the bumps 9.

In the structure of the semiconductor device 10 according to this first embodiment, since the memory cell and the interface have been formed within the different semiconductor elements, approximately 1000 pieces of the penetrating electrodes 7 are required in each of the DRAM chips 1. As a consequence, a pitch among the respective penetrating electrodes 7 is selected to approximately 70 μm. Among these penetrating electrodes 7, since such penetrating electrodes which are employed only in the communication operations between the DRAM chips 1 and the interface chip 2 need not be connected to the external module board, a total number of external terminals of the semiconductor device 10 which are connected to the module board amount to approximately 256. At this time, when the wiring pitch on the module board is considered, such an idea may be conceived. That is, the external terminals of the semiconductor device 10 must be arranged in such a plane area which is larger than, or equal to the plane dimension of the DRAM chips 1. Also, in view of the reliability of the connection portion with respect tot he temperature change after the mounting operation, it is desirable that the external terminals of the semiconductor device 10 are not arranged just under the DRAM chips 1, but arranged at the peripheral portion of the DRAM chips 1. To this end, in accordance with the present invention, since the resin substrate (FR-4) interposer 4 is provided independent from the interposer made of "Si (silicon)" 3, the wiring line are drawn in the plane dimension larger than, or equal to the plane dimension of the DRAM chips 1 so as to arrange the external terminals of the semiconductor device 10 at the peripheral portion of the DRAM chips 1. Furthermore, since the plural sheets of these interposers 3 and 4 are employed, the wiring lines can be readily drawn between the penetrating electrodes 7 among the respective DRAM chips 1, and the wiring lines having the different pitch, namely, the terminals of the module board. Also, since the interposer 3 made of Si is joined to the interposer 4 of the resin substrate by employing the solder having low rigidity and the under fill resin, the thermal stress can be reduced which is produced in the DRAM chips 1 and is caused by the difference between the linear expansion coefficient of Si and the linear expansion coefficient of the module board.

Figure 4A:
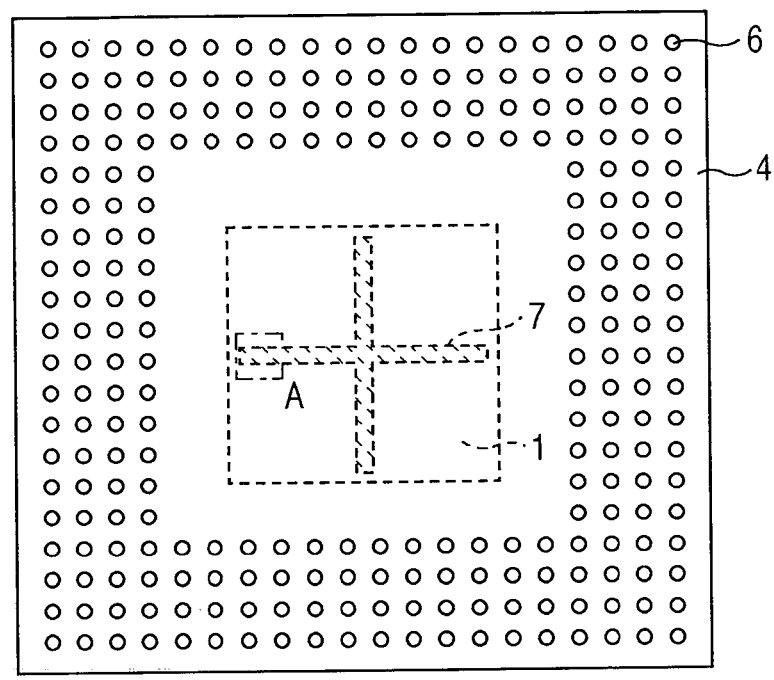
FIG. 4A and FIG. 4B are explanatory diagrams for explaining penetrating electrodes employed in the semiconductor device according to the first embodiment of the present invention.
Figure 4B:
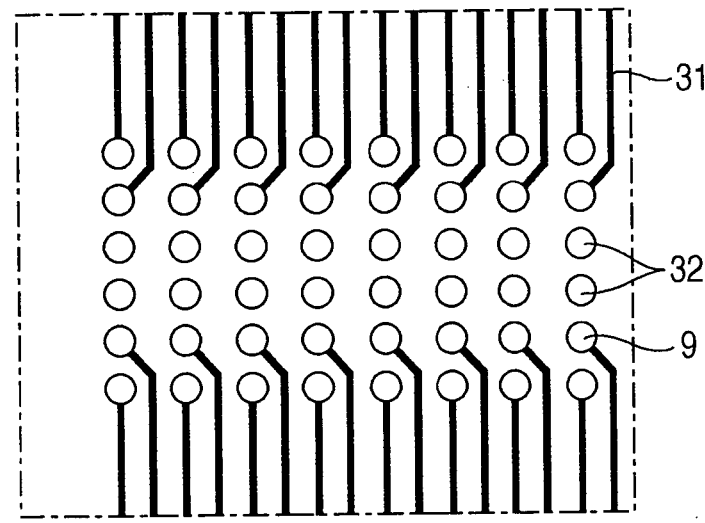

Next, a description is made of an arrangement of a penetrating electrode employed in the semiconductor device 10 according to this first embodiment with reference to FIG. 4A and FIG. 4B.

FIG. 4A and FIG. 4B are explanatory diagrams for explaining the penetrating electrode 7 employed in the semiconductor device 10 according to the first embodiment of the present invention. Similar to FIG. 2, FIG. 4A is a bottom view of the semiconductor device 10 according to the first embodiment of the present invention, and FIG. 4B is an enlarge diagram for enlarging a portion "A" in FIG. 4A. It should also be noted that the same reference numerals shown in FIG. 1 to FIG. 3 are employed as those for indicating the same structural elements of FIG. 4A and FIG. 4B.

As represented in FIG. 4A, the penetrating electrode 7 is arranged in a cross shape inside the DRAM chips 1. Further, as shown in FIG. 4B, 6 columns×6 rows of these penetrating electrodes 7 are arranged. Among these penetrating electrodes 7, bumps 32 arranged in two columns at a center thereof are employed for thermal conductions in order to improve the radiation characteristic, and these bumps 32 are not employed for electric signal communication purposes. Then, each of 2 columns (4 columns in total) of the bumps 32 on the outer side are employed as the signal wiring lines and the power supply wiring lines. As previously explained, since the bumps 32 for the thermal conduction purpose are arranged in the 2 columns at the center, if one wiring line 31 penetrates between the bumps 9, then the signal wiring line and the power supply wiring line can be realized. As a result, the wiring lines can be easily drawn, as compared with such a case that the center portion is employed as the signal pin. It should also be noted that in this fist embodiment, the penetrating electrodes are employed for the thermal condition. Alternatively, in the case that heating values of the semiconductor elements are small, the penetrating electrodes may be arranged only by such electrodes for signals and power supply. In this alternative case, 4 columns×4 rows of the penetrating electrodes 7 may be arranged in a cross shape.

Referring now to FIG. 5A to FIG. 5K, a first method of manufacturing the semiconductor device 10 according to this embodiment will be described.

FIG. 5A to FIG. 5K are step diagrams for indicating the first manufacturing method for manufacturing the semiconductor device 10 according to the first embodiment of the present invention. It should be noted that the same reference numerals indicated in FIG. 1 to FIG. 4 will be employed as those for denoting the same structural elements shown in FIG. 5A to FIG. 5K.

First, as shown in FIG. 5A, an interface chip "2'" and one sheet of a DRAM chip 1 are prepared. The interface chip "2'" has a sufficiently thick thickness before a back grinding process is carried out. The single DRAM chip 1 owns penetrating electrodes, the thickness of which has been processed to become 50 μm. At this time, the penetrating electrodes 7 have been provided in the DRAM chip 1. Bumps 9 have been formed on the upper portions of the penetrating electrodes 7 and also the upper portion of the interface chip "2'."

Next, as shown in FIG. 5B, under fill resin 8 is coated on a joint surface between the interface chip 2' and the DRAM chip 1, and, as indicated in FIG. 5C, the bumps 9 of both these chips 1 and 2' are joined to each other. At this time, the temperature is increased and ultrasonic vibrations are applied in order that Au (gold) employed as the bumps 9 of both the chips 1 and 2' are coupled to each other in the metal-to-metal coupling manner, so that a strong joint can be realized. Also, since the under fill resin 8 is hardened by this temperature increasing step, a stronger joint may be realized. A camber deformation has occurred in the thin DRAM chip 1 having the thickness of 50 µm before being joined. However, this camber deformation of the DRAM chip 1 can be forcibly corrected by joining the DRAM chip 1 to the interface chip 2' having the sufficiently thick thickness in such a manner that this DRAM chip 1 is depressed against the interface chip 2'. As a result, the camber after the joining operation can be decreased.

It should also be understood that in this first embodiment, the under fill resin 8 is coated before the interface chip 2' has been joined to the DRAM chip 1, and thereafter, both these chips 2' and 1 are joined to each other. Alternatively, in such a case that the under fill resin 8 having a high osmotic characteristic is employed, after the interface chip 2' is joined to the DRAM chip 1, this under fill resin 8 may be osmosed to spaces between the joined bumps 9. In this case, it is possible to prevent an occurrence of a void, which is caused by flux of the under fill resin 8, or the like when the bumps 9 are joined to each other. It should also be understood that when the sufficiently high osmotic characteristic of the under fill resin 8 to be employed cannot be obtained, there is a risk that the under fill resin 8 cannot be sufficiently sealed. As a consequence, a decision as to which processing step is conducted may be made by considering the characteristic of the under fill resin 8 to be employed.

Next, as indicated in FIG. 5D, Au bumps 9 are provided on a rear surface of the joined DRAM chip 1. Then, while the formed Au bumps 9 are employed, the manufacturing method is returned to the previous process step indicated in FIG. 5B. In this process step, a second stage of a DRAM chip 1 is stacked on the above-described DRAM chip 1 in accordance with a process operation similar to that of the above-explained process operation. Since this process step is repeatedly carried out, 8 sheets of DRAM chips 1 can be stacked on the interface chip 2'.

Next, as indicated in FIG. 5E, the under fill resin 8 of the DRAM chips 1 which have been stacked to each other in the process steps of FIG. 5B to FIG. 5D is coated, and thereafter, an Si interposer 3 having Au bumps 9B and penetrating electrodes 7B is put on. Subsequently, as represented in FIG. 5F, the stacked DRAM chips 1 are joined to the Si interposer 3.

It should be understood that in this first embodiment, the joining operations between the respective chips have been sequentially carried out. Alternatively, such a process step may be employed. That is, in this alternative process step, under fill resin which is employed in a joining process may be stacked to each other under provisionally hardened condition, and then, the stacked under fill resin may be completely hardened at such a stage that the Si interposer 3 is stacked thereon. In this alternative case, a thermal history applied to the entire chip may be decreased.

Next, as shown in FIG. 5G, a back grinding operation is carried out with respect to the interface chip 2 until the thickness of the interface chip 2 becomes 60 µm. At this time, 1 sheet of the Si interposer 3 and 8 sheets of the DRAM chips 1 have already been joined to each other with small camber. As a result, even when the thickness of the interface chip 2 becomes thin, it is possible to avoid that a large camber deformation is produced in the entire stacked structure. Also, the plane dimensions of the respective chips are equal to each other, and thin Si is not stripped. As a result, it is possible to avoid an occurrence of a broken failure when the entire structure is handled.

Next, as shown in FIG. 5H, solder balls 15 are formed on a rear surface of the Si interposer 3, and as represented in FIG. 5I, the Si interposer 3 is joined to a resin substrate interposer 4. At this time, a joint place between the Si interposer 3 and the resin substrate interposer 4 is sealed by using under fill resin 11.

Furthermore, as indicated in FIG. 5J, the resin substrate interposer 4, the interface chip 2, the DRAM chips 1, and the Si interposer 3 are sealed by mold resin 5. As shown in FIG. 5K, solder balls 6 which are used to be connected to a module board are formed on a rear plane of the resin substrate interposer 4, so that a semiconductor device 10 may be manufactured. In addition, if necessary, as represented in FIG. 1, a radiating plate 12 may be alternatively provided via a thermal conductive resin 13 on an upper plane of the mold resin 5. Since such process steps are executed, a highly reliable semiconductor device may be manufactured.

Referring now to FIG. 6A to FIG. 6J, a second method of manufacturing the semiconductor device 10 according to this embodiment will be described.

FIG. 6A to FIG. 6J are step diagrams for indicating the second manufacturing method for manufacturing the semiconductor device 10 according to the first embodiment of the present invention. It should be noted that the same reference numerals indicated in FIG. 1 to FIG. 5K will be employed as those for denoting the same structural elements shown in FIG. 6A to FIG. 6J.

In the first assembling method shown in FIG. 5A to FIG. 5K, after the dimensions as to the DRAM chips 1, the interface chip 2, and the Si interposer 3 have been dicing-processed in the chip dimensions, the dicing-processed chips/interposers are stacked on each other. This first assembling method corresponds to such an assembling method for suitably assembling, especially, high-end products due to the following reason. That is to say, even under such a condition that yields of the respective chips are deteriorated, the respective chips may be checked and only good chips may be collected so as to be stacked to each other. On the other hand, in an assembling method for a product in which yields of the respective chips are better, these chips are not stacked every chip, but wafers may be stacked to each other, so that a step for improving an assembling efficiency may be employed.

FIG. 6A to FIG. 6J show stack layer assembling steps under wafer condition. Firstly, as indicated in FIG. 6A, an interface chip "2'" formed under wafer condition and a DRAM chip "1'" formed under wafer condition are prepared. The interface chip 2' has a sufficiently thick thickness before a back grinding operation is carried out. The DRAM chip 1' is prepared before a back grinding operation is carried out. Since the back grinding operation has not yet been carried out for the DRAM chip 1', penetrating electrodes 7 made of Poly-Si are provided which have not penetrated through the DRAM chip 1', but have been embedded inside Si (silicon).

Next, as shown in FIG. 6B, under fill resin 8 is previously coated on a wafer joint portion, and as indicated in FIG. 6C, bumps of both the wafers are connected to each other by way of a metal-to-metal joint of Au (gold), and thus, the interface chip 2' formed under wafer condition is joined to the DRAM chip 1' formed under wafer condition. At this time, since such an under fill resin containing no flux is used, and/or a hole is formed in a portion of the wafer so as to escape the flux, it is possible to avoid that a void is produced in the under fill resin 8.

Next, as indicated in FIG. 6D, a back grinding operation is carried out with respect to a rear surface of the DRAM chip 1' in the wafer level so as to expose penetrating electrodes 7 made of Poly-Si.

Next, as shown in FIG. 6E, "Au" bumps 9 are provided on the exposed penetrating electrodes 7. Then, since the process steps shown in FIG. 6B to FIG. 6E are repeatedly executed, one sheet of the interface chip 2' and 8 sheets of the DRAM chips 1 can be stacked to each other under wafer condition.

Next, as represented in FIG. 6F, an "Si" interposer "3'" formed under wafer condition to which the back grinding operation has not yet been carried out is prepared. Then, as shown in FIG. 6G, the Si interposer 3' formed under wafer condition is connected to the stacked DRAM chip 1. Thereafter, as indicated in FIG. 6H, a back grinding operation is performed with respect to an rear surface of the Si interposer 3' so as to expose the penetrating electrodes 7.

Next, as shown in FIG. 6I, the back grinding operation is carried out as to a rear surface of the interface chip 2 until a thickness of this interface chip 2 becomes 60 μm, and as represented in FIG. 6J, the resulting interface chip 2 is dicing-processed, so that such a structural body may be accomplished in which the interface chip 2, 8 sheets of the DRAM chips 1, and the Si interposer 3 have been stacked to each other in the chip dimension. The subsequent step is advanced to the steps subsequent to the step shown in FIG. 5F, so that a semiconductor device 10 is manufactured.

It should be understood that the manufacturing steps shown in FIG. 5A to FIG. 5k and FIG. 6A to FIG. 6J merely exemplify one typical manufacturing method among the assembling methods under chip conditions and the stacking methods under wafer conditions in various conceivable embodiment modes of the present invention. Therefore, as apparent from the foregoing descriptions, even when any semiconductor devices manufactured in other process steps are obtained, if these semiconductor devices own the structure having the features of the present invention, then the effect of the present invention may be similarly achieved.

As previously described, in accordance with this first embodiment, while the interface chip which controls all of the memory cells in the unified manner is stacked on plural sheets of the DRAM chips which constitute the memory cells, these chips are connected to each other by employing the penetrating electrodes, so that the heating values can be reduced.

Also, since the interface chip having the large heating value is set to the uppermost layer of the semiconductor chips which are to be stacked to each other, the temperature increase of the semiconductor device when the semiconductor device is operated can be suppressed.

In addition, the interface chip is provided over the DRAM chips which are to be stacked to each other, and the Si interposer is provided under the DRAM chips. As a result, even in such a case that the DRAM chips are thin, stress occurred in such thin DRAM chips can be reduced.

Also, sine the plural sheets of interposers are employed, the wiring lines can be easily drawn in the largely different pitches, for instance, the penetrating electrodes between the chips and the terminals of the module board.

Moreover, the external terminals of the semiconductor device are not arranged just under the DRAM chips, but are arranged in the peripheral portion of the DRAM chips, so that the reliability of the connection portion with respect to the temperature change after the mounting operation can be improved.

Figure 7A:
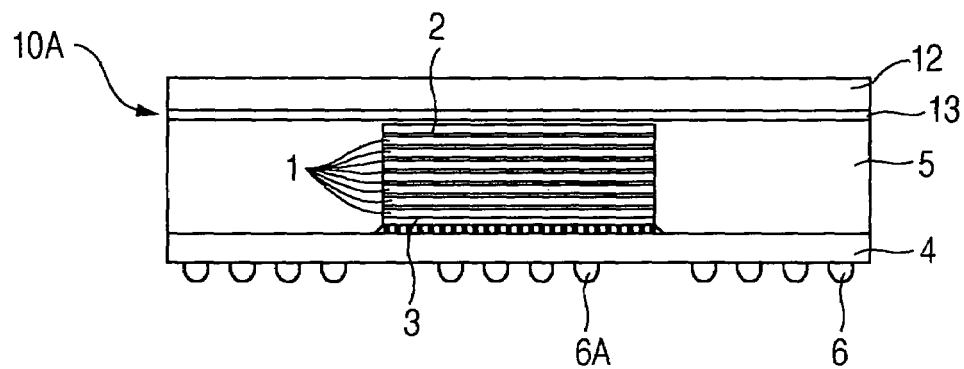
FIG. 7A and FIG. 7B are structural diagrams for showing an entire structure of a semiconductor device according to a second embodiment of the present invention.
Figure 7B:
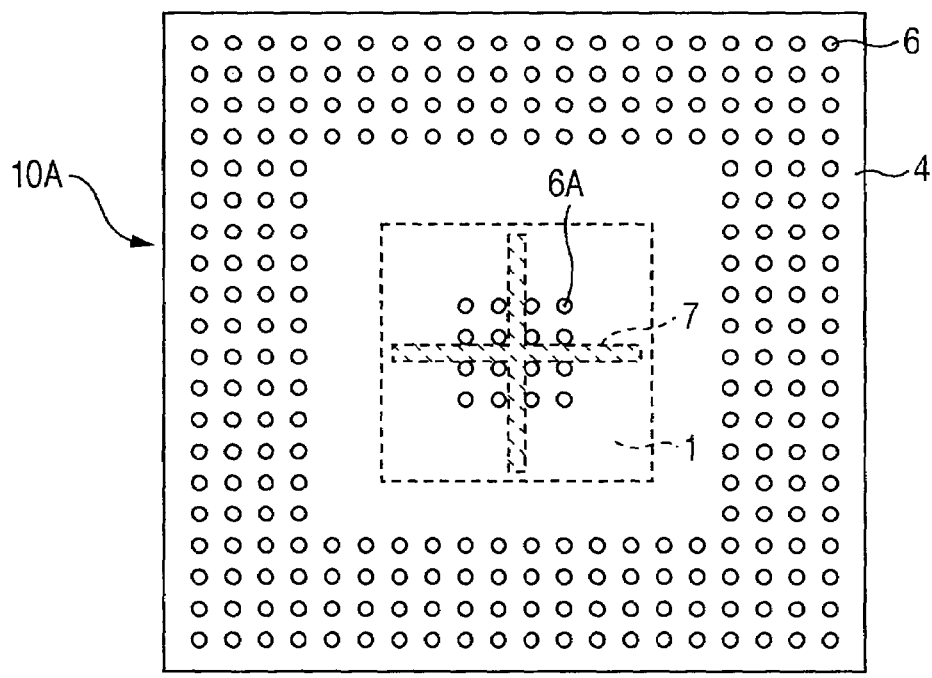

Referring now to FIGS. 7A and 7B, a description is made of a structure of a semiconductor device 10A according to a second embodiment of the present invention.

FIG. 7A and FIG. 7B are structural diagrams for showing an entire structure of the semiconductor device 10A according to the second embodiment of the present invention. FIG. 7A is a sectional side view are FIG. 7B is a bottom view of the semiconductor device 10A. It should be noted that the same reference numerals shown in FIG. 1 and FIG. 2 will be employed as those for indicating the same structural portions shown in FIG. 7A and FIG. 7B.

In the semiconductor device 10A of this second embodiment, not only solder balls 6 are provided at peripheral portions of a bottom plane of DRAM chips 1, but also, solder balls 6A which are used to join a resin substrate interposer 4 to a module board are provided just under a center portion of the DRAM chips 1.

In the case that the solder balls 6A are arranged just under the DRAM chips 1, a difference between a thermal deformation amount of Si (silicon) and a thermal deformation amount of the module board, which is caused by a change in temperatures may give an influence to the solder balls 6A as a load along a shearing direction. However, no thermal deformation amount difference between Si and the module board is produced in the center portion of the DRAM chips 1. As a result, only the small load along the shearing direction is produced in the solder balls 6A which are arranged in the vicinity of the center portion of the DRAM chips 1, so that the connection life time can be secured. Since the solder balls 6A are present just under the DRAM chips 1, the heat generation in the chips can be effectively dissipated to the module board.

As a consequence, such a solder ball arrangement according to this second embodiment may be employed in the case that a total number of wiring pins are large between the interface chip 2 and the module board and the solder balls 6 cannot be arranged only in the peripheral portion of the resin board interposer 4, and also, in such a case that the heating values of the interface chip 2 and the DRAM chips 1 are large.

Figure 8A:
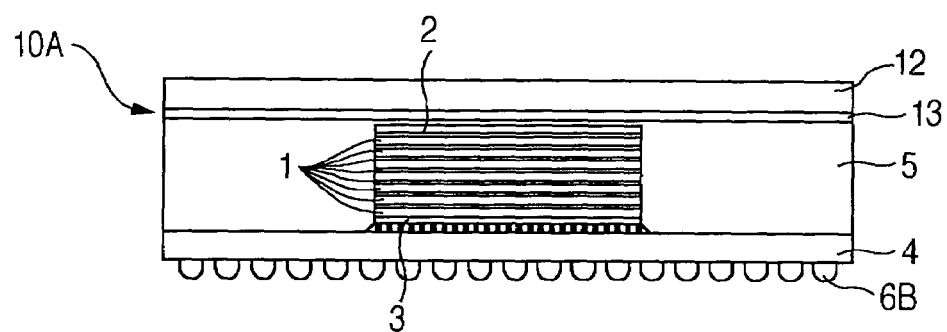
FIG. 8A and FIG. 8B are structural diagrams for showing an entire structure of a semiconductor device according to a fourth embodiment of the present invention.
Figure 8B:
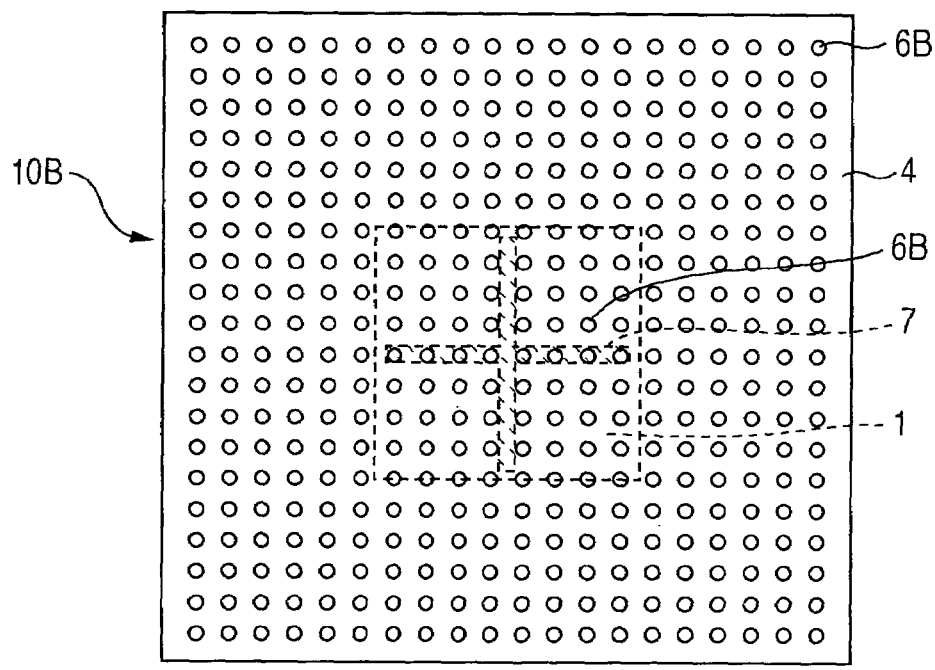

Next, a description is made of a structure of a semiconductor device 10B according to a third embodiment of the present invention with reference to FIG. 8A and FIG. 8B.

FIG. 8A and FIG. 8B are structural diagrams for indicating entire structures of the semiconductor device 10B according to the third embodiment of the present invention; FIG. 8A is a sectional side view and FIG. 8B is a bottom view of the entire structures. It should be noted that the same reference numerals shown in FIG. 1 and FIG. 2 are employed as those for indicating the same structural portions shown in FIG. 8A and FIG. 8B.

In the semiconductor device 10B of this third embodiment, solder balls 6B are arranged over the entire lower plane of a resin board interposer 4. As explained above, in such a case that the solder balls 6B are arranged over the entire lower plane of the resin substrate interposer 4, a large shearing deformation load is produced by a thermal deformation in the solder balls 6B which are arranged around corner portions of DRAM chips 1. As a result, there are some risks that a crack is made and breaking is made. As a consequence, these solder balls 6B are not proper if these solder balls are employed as signal wiring lines and power supply wiring lines. However, even when the crack is produced and breaking happens to occur in the solder balls 6B, since a thermal conductivity thereof is large, as compared with that of such a case that no solder ball is employed and an air layer is formed just under the DRAM chips 1, the heat radiating characteristic of the semiconductor device 10B may be improved, as compared with that of such a case that there is no solder ball 6B.

As a consequence, in such a semiconductor device that the heating values of the interface chip 3 and of the DRAM chips 1 are large and the heat radiating characteristic thereof must be improved, such a solder ball arrangement of this third embodiment may be employed.

Figure 9:
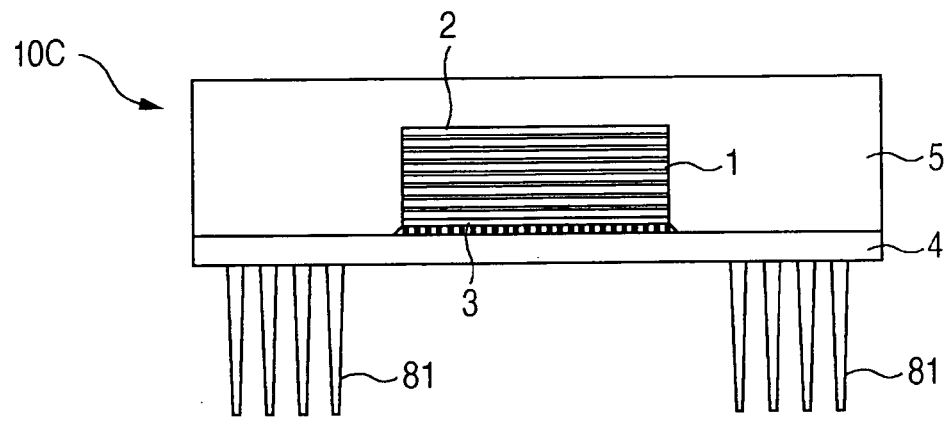
FIG. 9 is a sectional side view for indicating an entire structure of a semiconductor device, according to a fourth embodiment of the present invention.

Next, a description is made of a structure of a semiconductor device 10C according to a fourth embodiment of the present invention with reference to FIG. 9.

FIG. 9 is a sectional side view for indicating an entire structure of the semiconductor device 10C according to the fourth embodiment of the present invention. It should be understood that the same reference numerals shown in FIG. 1 and FIG. 2 are employed as those for indicating the same structural portions of FIG. 9.

In the semiconductor device 10C of this fourth embodiment, pins 81 are arranged on a lower plane of a resin substrate interposer 4, not solder balls are arranged. Since joining between the resin substrate interposer 4 and the module substrate is performed by employing the pins 81, the semiconductor device 10C does not receive a thermal history of a soldering reflow step. When a semiconductor device is processed in a reflow step, if resin such as an under fill has absorbed noisture, then there is such a risk that failures such as resin cracks happens to occur. As a consequence, in the case that a semiconductor device is mounted to a module board by a user, the user must manage the moisture absorptions. However, in accordance with this fourth embodiment, in such a case that the semiconductor device 10C is mounted on the module board by employing the pins 81, the user is not required to manage the moisture absorptions, and thus, the work load given to the user can be reduced. It should be understood that in this fourth embodiment, the user is required to set such a socket capable of accepting the pins 81 on the module board.

Figure 10:
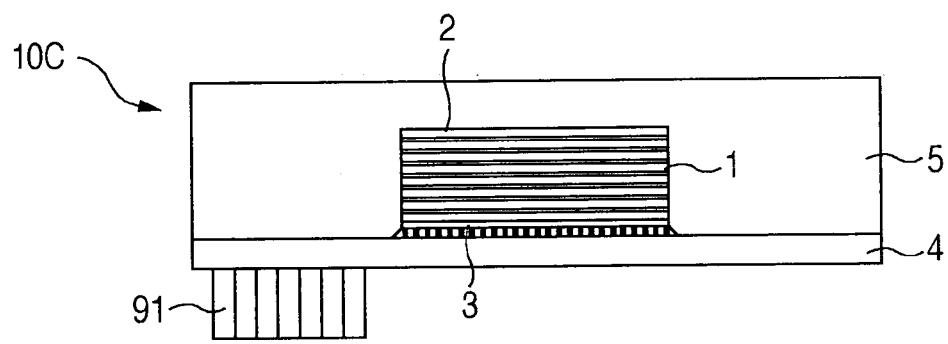
FIG. 10 is a sectional side view for showing an entire structure of a semiconductor device, according to a fifth embodiment of the present invention.

Next, a description is made of a structure of a semiconductor device 10D according to a fifth embodiment of the present invention with reference to FIG. 10.

FIG. 10 is a sectional side view for indicating an entire structure of the semiconductor device 10D according to the fifth embodiment of the present invention. It should be understood that the same reference numerals shown in FIG. 1 and FIG. 2 are employed as those for indicating the same structural portions of FIG. 10.

In the semiconductor device 10D of this fifth embodiment, a socket 91 is arranged on a lower plane of a resin substrate interposer 4, not solder balls are arranged. Similar to the fourth embodiment of FIG. 9, in this fifth embodiment, since a reflow step is not required on the side of a user, the work load of managing the moisture absorptions by the user can be reduced. However, in this fifth embodiment, the user is required to provide a socket corresponding to the above-described socket 91 on the module board.

Figure 11:
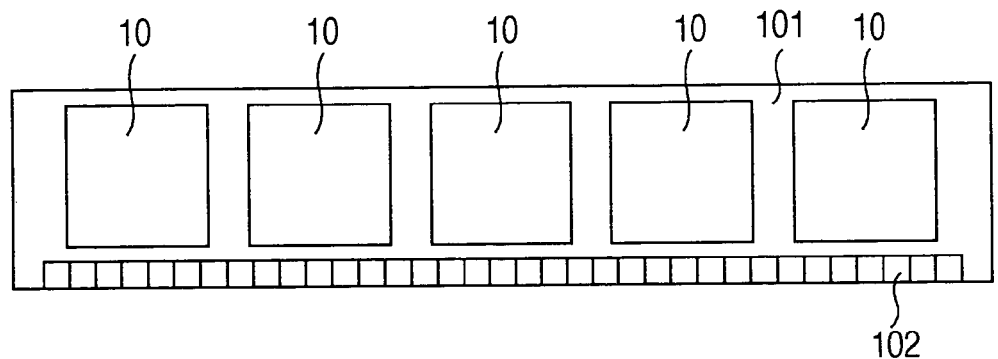
FIG. 11 is a sectional side view for indicating an entire structure of a semiconductor device, according to a sixth embodiment of the present invention.

Next, a description is made of a structure of a semiconductor device 10C according to a sixth embodiment of the present invention with reference to FIG. 11.

FIG. 11 is a sectional side view for indicating an entire structure of the semiconductor device 10C according to the sixth embodiment of the present invention. It should be understood that the same reference numerals shown in FIG. 1 and FIG. 2 are employed as those for indicating the same structural portions of FIG. 11.

In this sixth embodiment, plural sets of the semiconductor devices 10 having the above-described structures are mounted on a single sheet of module board 101 so as to realize a memory module having a large storage capacity. The module board 101 is equipped with a module board terminal 102. As to the semiconductor device 10, approximately 6 pieces of the semiconductor devices 10 may be mounted on a single plane of a module board which is defined by the DIMM (dual inline memory module) standard, and approximately 12 pieces of the semiconductor devices 10 may be mounted on both planes of such a DIMM-standardized module board. As previously explained, assuming now that a storage capacity of a single piece of the above-described semiconductor device 10 is equal to 0.5 Gbytes, a total storage capacity of a memory module equipped with 12 pieces of the semiconductor devices 10 becomes 6 Gbytes. As a consequence, since this semiconductor device 10 is mounted on a DIMM-standardized module board, or an DODIMM-standardized module board, memory module products having very large storage capacities may be obtained, as compared with presently available products having the same standards.

Figure 12:
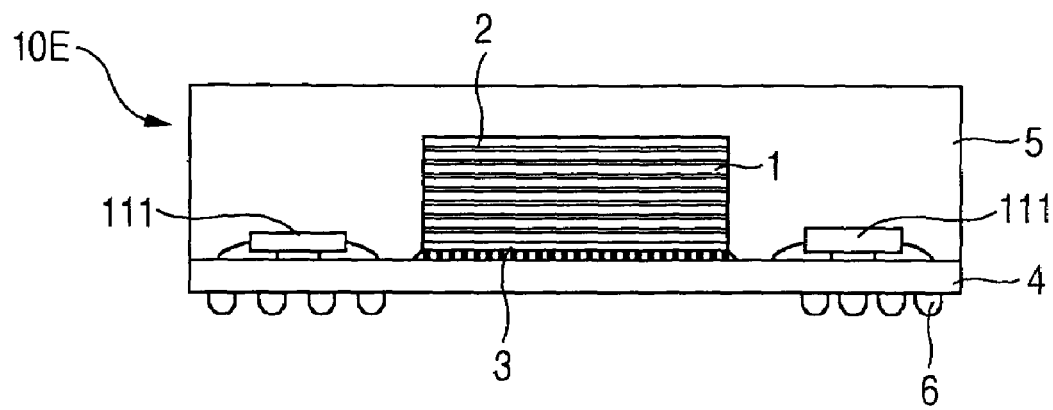
FIG. 12 is a sectional side view for showing an entire structure of a semiconductor device, according to a seventh embodiment of the present invention.

Next, a description is made of a structure of a semiconductor device 10E according to a seventh embodiment of the present invention with reference to FIG. 12.

FIG. 12 is a sectional side view for indicating an entire structure of the semiconductor device 10E according to the seventh embodiment of the present invention. It should be understood that the same reference numerals shown in FIG. 1 and FIG. 2 are employed as those for indicating the same structural portions of FIG. 12.

In this seventh embodiment, an element other than the DRAM chips 1 has been mounted inside the semiconductor device 10E. In this semiconductor device 10E, a plane dimension of a resin substrate interposer 4 is large, as compared with a plane dimension of the DRAM chips 1. As a result, a passive element 111 such as a chip resistor and a chip capacitor may be mounted on a surface of the resin board interposer 4. As explained above, since the passive element 111 is built in the semiconductor device 10E, the function of this semiconductor device 10E may be emphasized.

Figure 13:
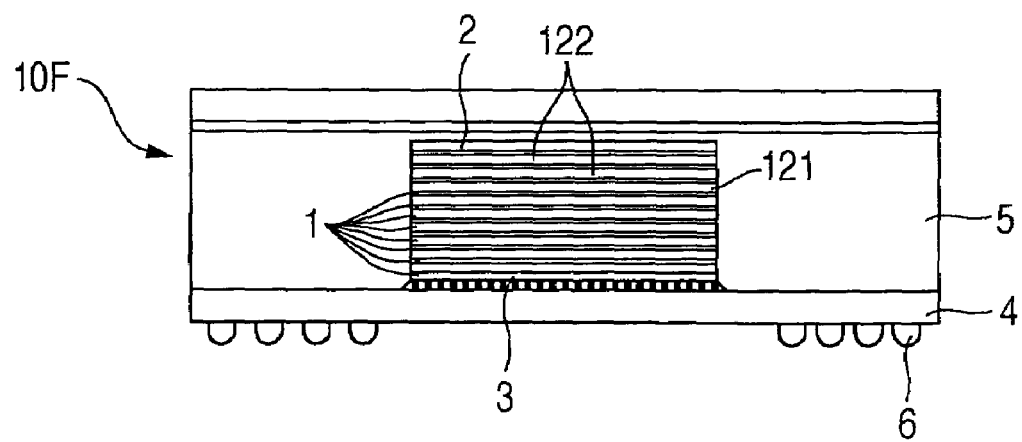
FIG. 13 is a sectional side view for indicating an entire structure of a semiconductor device, according to an eighth embodiment of the present invention.

Next, a description is made of a structure of a semiconductor device 10F according to an eighth embodiment of the present invention with reference to FIG. 13.

FIG. 13 is a sectional side view for indicating an entire structure of the semiconductor device 10F according to the eighth embodiment of the present invention. It should be understood that the same reference numerals shown in FIG. 1 and FIG. 2 are employed as those for indicating the same structural portions of FIG. 13.

In this eighth embodiment, while an "Si" interposer 121 is provided on an upper portion of 8 sheets of DRAM chips 1 which have been stacked to each other, a semiconductor element 122 other than a DRAM chip, for example, a logic circuit and the like is mounted on an upper portion of the Si interposer 121, and an interface chip 2 is arranged on the uppermost portion of the DRAM chips 1. As previously explained, since the Si interposer 121 is arranged between the DRAM chips 1 and the circuit other than the DRAM chip, various sorts of circuits may be mounted in a mixing manner with the DRAM chips 1. At this time, similar to the DRAM chips 1, penetrating electrodes are arranged also in the semiconductor chip 122 other than the DRAM chips 1 in a cross shape, so that various sorts of chips may be combined with each other in correspondence with various requests made by users. Moreover, there is no limitation that a total number of semiconductor chips other than the DRAM chips is equal to 1, and therefore, plural sheets of semiconductor chips may be mounted.

Figure 14:
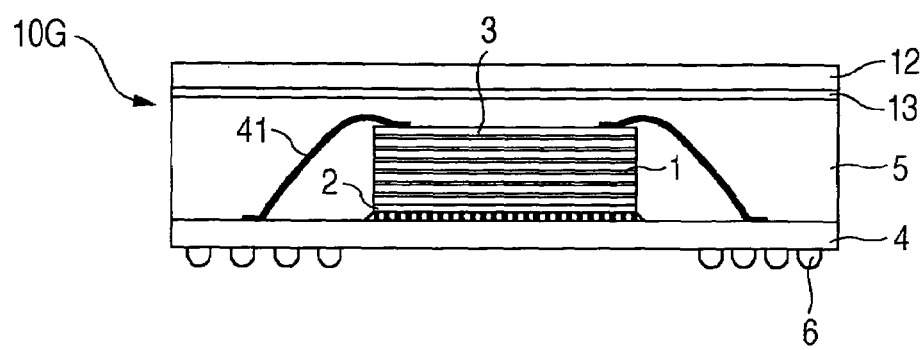
FIG. 14 is a sectional side view for showing an entire structure of a semiconductor device, according to a ninth embodiment of the present invention.
Figure 15:
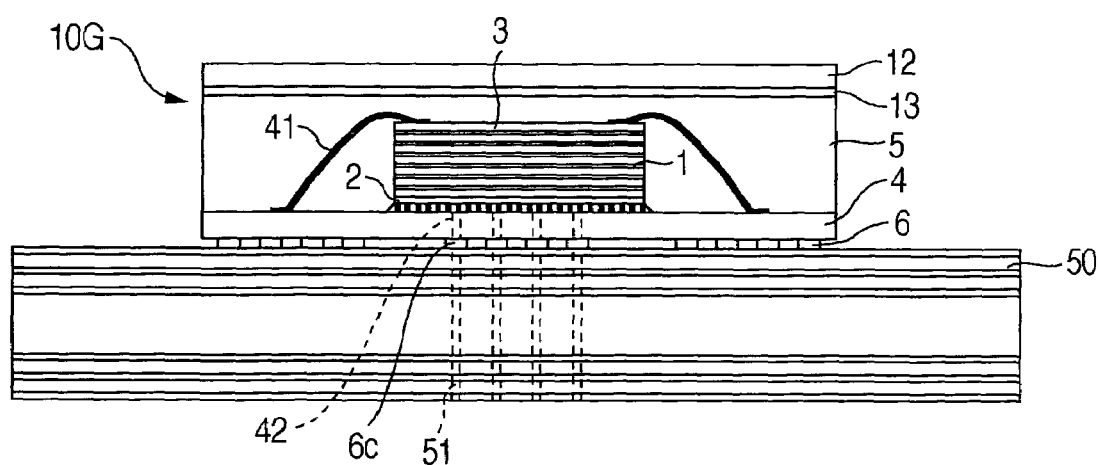
FIG. 15 is a sectional side view for indicating a structure of a memory module on which the semiconductor device according to the ninth embodiment of the present invention is mounted.

Next, a description is made of a structure of a semiconductor device 10G according to a ninth embodiment of the present invention with reference to FIG. 14 and FIG. 15.

FIG. 14 is a sectional side view for indicating an entire structure of the semiconductor device 10G according to the ninth embodiment of the present invention. FIG. 15 is a sectional side view for indicating a structure of a memory module which mounts thereon the semiconductor device 10G according to the ninth embodiment of the present invention. It should be noted that the same reference numerals shown in FIG. 1 and FIG. 2 are employed as those for indicating the same structural portions shown in FIG. 14 and FIG. 15.

As indicated in FIG. 14, this semiconductor device 10G is constituted by 8 sheets of DRAM chips 1, an interface chip 2, an "Si" interposer 3, and a resin substrate interposer 4. The DRAM chips 1 have been stacked on each other. The interface chip 2 is arranged on a lower portion of the DRAM chips 1. The Si interposer 3 corresponds to a second interposer which is arranged at an upper portion the stacked DRAM chips 1. The resin substrate interposer 4 is arranged at a lower portion of this Si interposer 3. These members 1, 2, 3, and 4 are sealed by using mold resin 5. Furthermore, a solder ball 6 is provided and functions as an external terminal which is used so as to be connected with a module board. In other words, with respect to the structure shown in FIG. 1, the upper/lower arrangements of the Si interposer 3 and the interface chip 2 are reversed. Also, since the thicknesses (for example, 60 μm) of the interface chip 2 and the Si interposer 3 are made thicker than, or equal to the thicknesses (for instance, 50 μm) of the DRAM chips 1, heat stress produced in the DRAM chips 1 due to temperature changes when the semiconductor device is assembled and is operated can be reduced, and further, it is possible to avoid that since the DRAM chips 1 are contaminated by the resin of the peripheral portion, the element characteristic is deteriorated. Also, as to the Si interposer 3, it is preferable to employ such a member having a higher linear expension coefficient than the linear expension coefficient of the semiconductor element 1. As a consequence, in this embodiment, Si (silicon) is employed which corresponds to the same material as that of the semiconductor element 1. It should be understood that as the second interposer, such ceramics as an aluminium nitride and an aluminium oxide may be employed.

The plural sheets of DRAM chips 1 are connected to the interface chip 2 by employing penetrating electrodes. An electrode which is provided on the Si interposer 3 is connected to an electrode which is provided on the resin substrate interposer 4 by employing a wire bonding 41.

As shown in FIG. 15, copper vias 42 are provided in the resin substrate interposer 4. The copper vias 42 have penetrated through the resin substrate interposer 4 and owns a superior thermal conductivity. The copper vias 42 are connected to solder balls 6C formed on a lower plane of the resin substrate interposer 4. On the other hand, copper vias 51 are provided in a module board 50. The copper vias 51 have penetrated through the module board 50, and own a superior thermal conductivity. The copper vias 51 are joined to the copper vias 42 by the solder balls 6C, and the heat generated from the interface chip 2 is radiated through these copper vias 42 and 51 to an external area.

With employment of the above-described structure of the semiconductor device 10G, while the interface chip which controls all of the memory cells in the unified manner is stacked under plural sheets of the DRAM chips which constitute the memory cells, these chips are connected to each other by employing the penetrating electrodes, so that the heating values can be reduced.

Also, the interface chip is provided under the DRAM chips which are to be stacked to each other, and the Si interposer is provided over the DRAM chips. As a result, even in such a case that the DRAM chips are thin, stress occurred in such thin DRAM chips can be reduced.

Moreover, the external terminals of the semiconductor device are not arranged just under the DRAM chips, but are arranged in the peripheral portion of the DRAM chips, so that the reliability of the connection portion with respect to the temperature change after the mounting operation can be improved.

While the present invention has been described in the concrete manner based upon the various embodiment, the present invention is not limited only to the above-explained embodiments, but may be modified, changed, and substituted without departing from the technical scope and spirit of the present invention.

The invention claimed is:

1. A semiconductor device having a plurality of semiconductor devices which have been stacked to each other, comprising:
   a plurality of penetrating electrodes adapted to electrically connect at least one semiconductor element among said plural semiconductor devices to another semiconductor element, said plural penetrating electrodes penetrating through said semiconductor devices;
   an interface chip which is made thicker than, or equal to the thickness of said semiconductor devices and constitutes an interface for interfacing between said semiconductor elements and an external unit,
   wherein said interface chip is connected to the penetrating electrode and disposed on an uppermost layer or under a lowermost layer of said plurality of semiconductor devices, thereby the penetrating electrode is not provided with said interface chip.

2. A semiconductor device having a plurality of semiconductor devices which have been stacked to each other, in which at least one semiconductor element among said plural semiconductor devices is electrically conducted to another semiconductor element by employing a penetrating electrode, comprising:
   an interface chip which is stacked on, or under said plurality of stacked semiconductor elements, and which constitutes an interface for interfacing between said semiconductor elements and an external unit;
   a resin interposer; and
   a second interposer which is arranged between said resin interposer and said plurality of stacked semiconductor elements, which has a thickness thicker than a thickness of said semiconductor element, and owns a linear expansion coefficient; said linear expansion coefficient of said second interposer being smaller than a linear expansion coefficient of said resin interposer, and also being larger than, or equal to linear expansion coefficients of said plurality of stacked semiconductor elements, wherein said interface chip is arranged on an uppermost layer of said plurality of stacked semiconductor elements.

3. A semiconductor device having a plurality of semiconductor devices which have been stacked to each other, in which at least one semiconductor element among said plural semiconductor devices is electrically conducted to another semiconductor element by employing a penetrating electrode, comprising:

an interface chip which is stacked on, or under said plurality of stacked semiconductor elements, and which constitutes an interface for interfacing between said semiconductor elements and an external unit;

a second interposer which is arranged on an uppermost layer of said plurality of stacked semiconductor elements and has a thickness thicker than, or equal to a thickness of said semiconductor element, and also, owns a linear expansion coefficient; said linear expansion coefficient of said second interposer being larger than, or equal to linear expansion coefficients of said plurality of stacked semiconductor elements; and a resin interposer; wherein:

said interface chip is arranged between said resin interposer and said plurality of stacked semiconductor elements.

4. A semiconductor device as claimed in claim 2 wherein: said second interposer is constructed of Si (silicon).

5. A semiconductor device as claimed in claim 3 wherein: said second interposer is constructed of Si (silicon).

6. A semiconductor device as claimed in claim 1 wherein: at least two, or more sheets of said semiconductor elements correspond to memories.

7. A semiconductor device as claimed in claim 1, wherein said interface chip is constituted by silicon.

8. A semiconductor device as claimed in claim 2, wherein said linear expansion coefficient of said second interposer is larger than, or equal to linear expansion coefficients of said plurality of stacked semiconductor elements.

* * * * *